United States Patent
Wei

(10) Patent No.: US 10,276,758 B2
(45) Date of Patent: Apr. 30, 2019

(54) SINGULATON OF LIGHT EMITTING DEVICES BEFORE AND AFTER APPLICATION OF PHOSPHOR

(71) Applicant: Lumileds LLC, San Jose, CA (US)

(72) Inventor: Frank Lili Wei, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 14/384,720

(22) PCT Filed: Mar. 8, 2013

(86) PCT No.: PCT/IB2013/051836
§ 371 (c)(1),
(2) Date: Sep. 12, 2014

(87) PCT Pub. No.: WO2013/140291
PCT Pub. Date: Sep. 26, 2013

(65) Prior Publication Data
US 2015/0008459 A1   Jan. 8, 2015

Related U.S. Application Data

(60) Provisional application No. 61/612,427, filed on Mar. 19, 2012.

(51) Int. Cl.
*H01L 29/20* (2006.01)
*H01L 33/50* (2010.01)
*H01L 33/00* (2010.01)

(52) U.S. Cl.
CPC ........ *H01L 33/505* (2013.01); *H01L 33/0095* (2013.01); *H01L 33/507* (2013.01); *H01L 2933/0041* (2013.01)

(58) Field of Classification Search
CPC ...................................................... H01L 33/505
(Continued)

(56) References Cited

U.S. PATENT DOCUMENTS 6,329,709 B1 * 12/2001 Moden ................ H01L 23/3107
257/690
7,718,449 B2   5/2010 Gao et al.
(Continued)

FOREIGN PATENT DOCUMENTS

CN    101188268 A    5/2008
CN    101188268 A    5/2008
(Continued)

OTHER PUBLICATIONS

CN Office Action, Application 201380015479.X, dated Sep. 19, 2016, 29 pps.
(Continued)

*Primary Examiner* — Ajay K Arora
(74) *Attorney, Agent, or Firm* — Volpe and Koenig, P.C.

(57) ABSTRACT

A two-stage singulation process is used in the fabrication of phosphor coated light emitting elements. Prior to the application of the phosphor coating, the individual light emitting elements are singulated using a laser dicing process (130); after application of the phosphor coating (150), the phosphor coated light emitting elements are singulated using a mechanical dicing process (180). Before laser dicing of the light emitting elements, the wafer is positioned on a piece of dicing- or die-attach-tape held by a frame; after laser dicing, the tape is stretched (140) to provide space between the individual light emitting elements that allows for the wider kerf width of the subsequent mechanical dicing (180) after application of the phosphor coating (150).

4 Claims, 2 Drawing Sheets

(58) Field of Classification Search
USPC .......................................................... 257/89
See application file for complete search history.

(56) References Cited

U.S. PATENT DOCUMENTS

| | | | |
|---|---|---|---|
| 8,114,689 B2 | 2/2012 | Kang et al. | |
| 8,350,280 B2 | 1/2013 | Lai et al. | |
| 8,541,801 B2 | 9/2013 | Kim et al. | |
| 2005/0274967 A1 | 12/2005 | Martin et al. | |
| 2006/0022211 A1* | 2/2006 | Yatsuda | H01L 25/0753 257/98 |
| 2006/0079072 A1* | 4/2006 | David | H01L 21/78 438/460 |
| 2006/0115962 A1* | 6/2006 | Maeda | H01L 21/78 438/460 |
| 2008/0102541 A1* | 5/2008 | Kang | H01L 33/0095 438/15 |
| 2008/0157235 A1 | 7/2008 | Rogers et al. | |
| 2010/0029023 A1* | 2/2010 | Neff | H01L 33/0095 438/15 |
| 2010/0148200 A1* | 6/2010 | Lai | H01L 33/54 257/98 |
| 2011/0266560 A1 | 11/2011 | Yao et al. | |
| 2011/0266569 A1 | 11/2011 | Basin et al. | |
| 2011/0312193 A1 | 12/2011 | Abe | |
| 2012/0299043 A1* | 11/2012 | Hsu | H01L 33/507 257/98 |
| 2013/0200398 A1* | 8/2013 | Wang | H01L 33/505 257/88 |

FOREIGN PATENT DOCUMENTS

| | | |
|---|---|---|
| CN | 101681695 A | 3/2010 |
| CN | 101752483 A | 6/2010 |
| CN | 101752483 A | 6/2010 |
| DE | 102008010512 A1 | 8/2009 |
| DE | 102010022561 A1 | 12/2011 |
| TW | 201010136 A | 3/2010 |

OTHER PUBLICATIONS

CN Decision on Rejection dated Jun. 7, 2017, China Patent Application No. 201380015479.X, 26 pages.
Taiwan Office Action dated Sep. 22, 2017, Taiwan Patent Application No. 102109541, 5 pages.
EPO as ISA, PCT/IB2013/051836 filed Mar. 8, 2013, "International Search Report and Written Opinion", dated Jul. 26, 2013, 11 pages.
Office Action dated Jan. 11, 2017, Taiwan Patent Application No. 102109541, 5 pages.
Notice of Reexamination dated Mar. 29, 2018, China Patent Application No. 201380015479.X, 15 pages.

* cited by examiner

SINGULATON OF LIGHT EMITTING DEVICES BEFORE AND AFTER APPLICATION OF PHOSPHOR

CROSS-REFERENCE TO PRIOR APPLICATIONS

This application is the U.S. National Phase application under 35 U.S.C. § 371 of International Application No. PCT/IB2013/051836, filed on Mar. 8, 2013, which claims the benefit of U.S. Patent Application No. 61/612,427, filed on Mar. 19, 2012. These applications are hereby incorporated by reference herein.

FIELD OF THE INVENTION

This invention relates to the field of solid state light emitters, and in particular to the fabrication of light emitting devices with one or more wavelength conversion layers, such as layers that include phosphors.

BACKGROUND OF THE INVENTION

The use of solid state light emitting devices (LEDs) for conventional lighting applications, such as vehicle light bulbs, interior and exterior lighting, and so on, continues to increase, due primarily to their expected useful life, and their efficiency. In these applications, the production of white light is often a requirement.

To produce white light, or any light that differs in color from the color produced inherently from a given light emitting material, a color shift and color combination is generally used to achieve the desired color, or, with regard to while light, the desired color temperature. A color shift (wavelength conversion) can be provided by materials, such as phosphors, that absorb light of one color and emit light of a different color. Typically, a layer of material that contains phosphor particles is applied upon the upper surface of the light emitting device. As the light exits the light emitting device and enters the phosphor layer, some or all of the emitted light strike the phosphor particles, such that the light output from the phosphor layer comprises a combination of the original emitted light and the subsequently produced converted light. The composite color output will be dependent upon the proportion of light at each wavelength (color), which is dependent primarily upon the density and distribution of the phosphor particles.

To reduce manufacturing costs, the phosphor layer is applied to a wafer of fabricated light emitting elements (dies). After applying the phosphor layer, the wafer is sliced/diced to provide the individual/singulated light emitting elements. Generally, a laser-based process is preferred for dicing the wafer into individual light emitting elements; however, the phosphor layer can be damaged if exposed to laser energy. Accordingly, mechanical processes are used for dicing phosphor coated wafers.

A disadvantage of having to mechanically dice phosphor coated wafers is that the kerf width of a saw is typically in the order of 50-100 um, which is substantially wider than the typical kerf width of a laser cut, typically in the order of 10-15 um. In order to allow for this wider kerf width and the manufacturing tolerances, the individual light emitting elements must be spaced farther apart, by 200 um or more, reducing the number of light emitting elements that can be fabricated on each wafer. For example, if the light emitting element is 500 um×500 um, and the dicing lane width, often called a "street", between light emitting elements is 200 um, only about 36% of the available wafer area will be used for the light emitting elements, compared to almost 90% wafer area utilization for non phosphor coated light emitting elements using laser slicing with a 30 um street.

SUMMARY OF THE INVENTION

It would be advantageous to be able to increase the number of phosphor coated light emitting devices that can be produced per wafer. It would also be advantageous to maintain the ability to apply the phosphor to the light emitting elements in a wafer-scale process.

To better address one or more of these concerns, in an embodiment of this invention, a two-stage singulation process is used in the fabrication of phosphor coated light emitting elements. Prior to the application of the phosphor coating, the individual light emitting elements are singulated using a laser dicing process; after application of the phosphor coating, the phosphor coated light emitting elements are singulated using a mechanical dicing process. Before laser dicing of the light emitting elements, the wafer is positioned on a piece of dicing- or die-attach-tape held by a frame; after laser dicing, the tape is stretched to provide space between the individual light emitting elements that allows for the wider kerf width of the subsequent mechanical dicing after application of the phosphor coating.

BRIEF DESCRIPTION OF THE DRAWINGS

The invention is explained in further detail, and by way of example, with reference to the accompanying drawings wherein.

Throughout the drawings, the same reference numerals indicate similar or corresponding features or functions. The drawings are included for illustrative purposes and are not intended to limit the scope of the invention.

DETAILED DESCRIPTION

In the following description, for purposes of explanation rather than limitation, specific details are set forth such as the particular architecture, interfaces, techniques, etc., in order to provide a thorough understanding of the concepts of the invention. However, it will be apparent to those skilled in the art that the present invention may be practiced in other embodiments, which depart from these specific details. In like manner, the text of this description is directed to the example embodiments as illustrated in the Figures, and is not intended to limit the claimed invention beyond the limits expressly included in the claims. For purposes of simplicity and clarity, detailed descriptions of well-known devices, circuits, and methods are omitted so as not to obscure the description of the present invention with unnecessary detail.

For ease of illustration and disclosure, the term "phosphor" is used herein as an example wavelength conversion material, although one of skill in the art will appreciate that the principles presented herein are applicable for other materials that are used to produce light at a different wavelength from the light that is emitted from the light emitting element.

Figure 1:
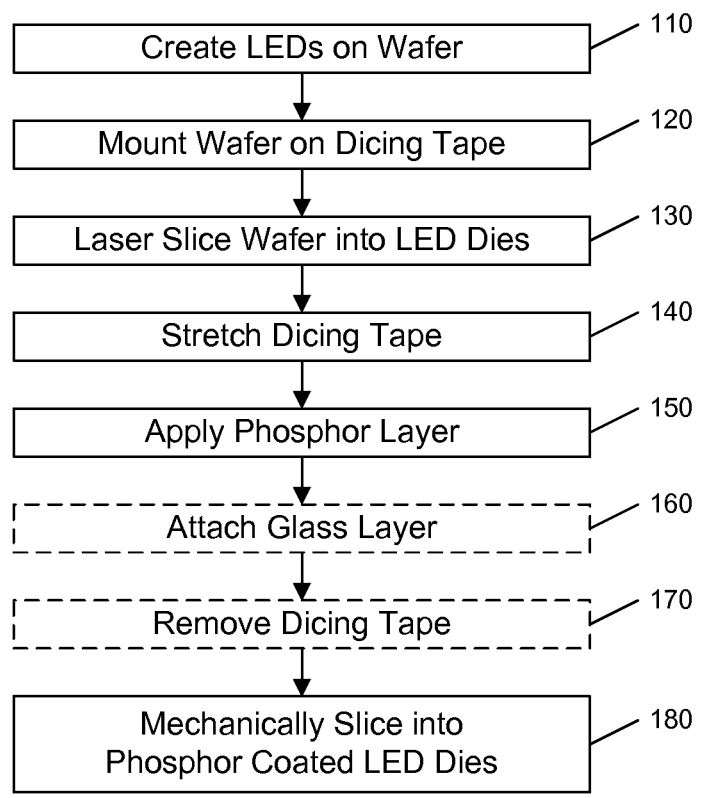
FIG. 1 illustrates an example flow diagram for fabricating phosphor coated light emitting elements.

FIG. 1 illustrates an example flow diagram for fabricating phosphor coated light emitting elements in accordance with aspects of this invention, and FIGS. 2A-2H illustrate an example fabrication of phosphor coated light emitting elements using such a process. The aspects of this invention will be described in the context of the flow diagram of FIG. 1, with reference to the example elements in FIG. 2. The elements of FIG. 1 begin with the digit "1"; the elements of FIG. 2 begin with the digit "2".

Figure 2A:
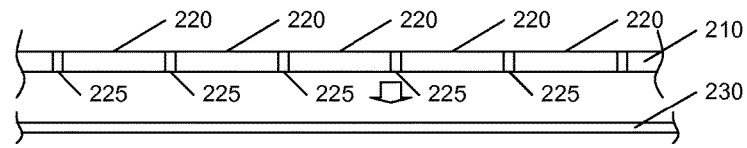
FIGS. 2A-2H illustrate an example fabrication of phosphor coated light emitting elements.

At 110, a plurality of light emitting elements 220 are fabricated on a wafer 210, using any of available fabrication techniques, such as the fabrication of GaN-epi thin film devices. The elements 220 are fabricated with a street 225 between each of the elements that allows for slicing/dicing the wafer without affecting the operation of each element 220 after such singulation. At 120, and as shown in FIG. 2A, the wafer 210 is attached to a flexible film 230, such as a piece of dicing tape or die-attach tape held within a frame (not shown).

Figure 2B:
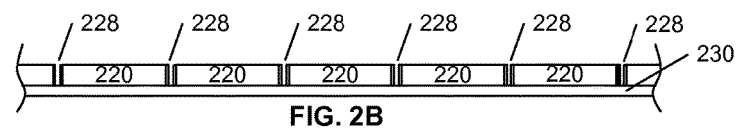

At 130, and as illustrated in FIG. 2B, the wafer 210 on the flexible film 13 is sliced (singulated) to provide individual/singulated light emitting dies 220. Because at this stage the light emitting elements 220 have not yet been coated with a wavelength conversion material, such as a phosphor, the use of a laser to effect the slicing will not adversely affect the performance of the light emitting elements 220. Accordingly, because a laser is able to slice the wafer 210 with a kerf width 228 of approximately 10-15 um, the aforementioned street 225 between the elements 220 may be as small as 20 um or so, allowing for process variances. The street 225 is an order of magnitude less than the spacing that is typically required for phosphor coated light emitting elements that are sliced/diced using a mechanical slicing process.

With a street 225 in the order of 20 um, however, if the elements 220 are subsequently coated with a phosphor, mechanically slicing techniques cannot be used to slice/dice the coated elements 220.

Figure 2C:
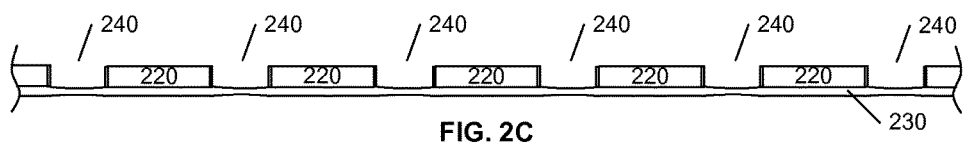

To provide sufficient spacing between the elements 220 to allow for mechanical slicing, at 140 the flexible film 230 is controllably stretched to provide a space 240 that is sufficient to accommodate the kerf width of the mechanical slicing element and associated manufacturing variances, as illustrated in FIG. 2C. As noted above, this space 240 may be in the order of 200 um, to accommodate a typical kerf width of 50-100 um. However, this space 240 is merely space on a relatively inexpensive flexible film 230, as contrast to the relatively costly space on a fabricated wafer, such as is required using the conventional wafer-level fabrication of phosphor coated light emitting elements.

Figure 2D:
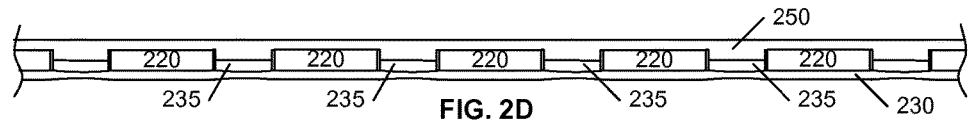

At 150, a phosphor coating 250 is applied to the light emitting elements 220 that are situated on the stretched flexible film 230, forming a sheet of phosphor coated light emitting elements 220, as illustrated in FIG. 2D. Optionally, a low-cost filler material 235 may first be disposed between the elements 220, to reduce the quantity of the higher-cost phosphor 250 that is placed within these spaces. Optionally, the filler material 235 may fill the volume between the elements 220, and may even extend above the plane of the upper surface of the elements 220 between the elements 220. In FIG. 2D, the example filler material 235 extends up to about half the height of the elements 220, allowing for the phosphor to extend below the upper surface, thereby providing wavelength conversion for light that is emitted from the sides of the elements 220. Alternatively, or additionally, the phosphor coating 250 may include a preformed phosphor-embedded sheet that is laminated over the light emitting elements 220 on the film 230.

Figure 2E:
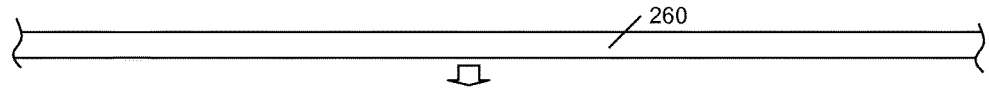

Optionally, at 160, a transparent substrate 260, such as glass, is attached to the sheet of phosphor 250 coated elements 220 to facilitate subsequent handling of the sheet and/or to protect the subsequently singulated phosphor coated elements 220, as illustrated in FIG. 2E.

Figure 2F:
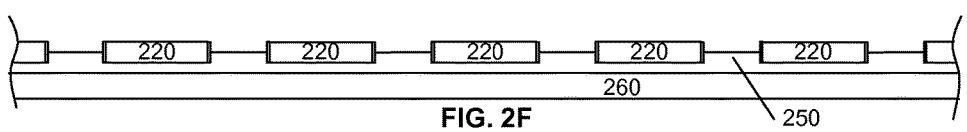

At 170, if the phosphor coating 250 is sufficient to support the sheet, or if the substrate 260 is used, the film 230 may be removed. Otherwise, the film 230 may be removed from each element 220 after the second singulation. If the electrical connections to the light emitting elements 220 are not obstructed by the film 230, the film 230 need not be removed. FIG. 2F illustrates an example in which the substrate 260 is used to support the sheet of phosphor coated elements 220, and the film 230 and filler material 235 are removed.

Figure 2G:
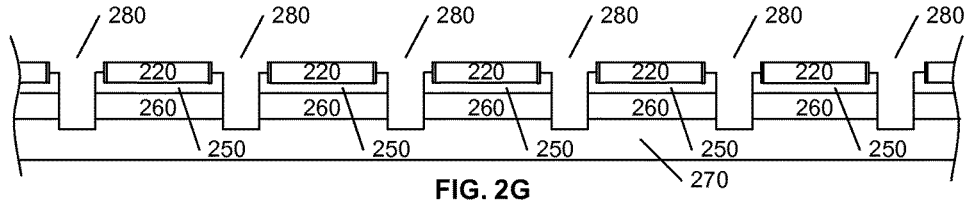

At 180, the sheet of phosphor 250 coated elements 220 are sliced/diced (a second singulation) to provide individual/singulated phosphor 250 coated elements 220. As noted above, because phosphor is adversely affected by laser emissions, a mechanical process is used to slice/dice the sheet, producing a kerf width 280 that is substantially wider than the kerf width 228 produced by laser slicing the original wafer 210. FIG. 2G illustrates the use of an adhesive support surface 270 that maintain a stable placement of the elements 220 as the mechanical slicing/dicing is performed.

Figure 2H:
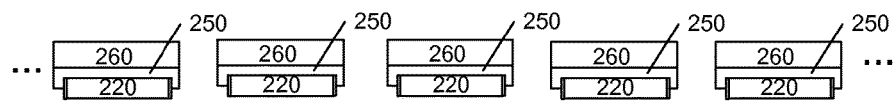

After singulating the phosphor 250 coated light emitting elements 220 on the support surface 270, the individual light emitting devices are removed from the support 270, as illustrated in FIG. 2H. In each of these devices, light at a first wavelength is emitted from the element 220, some or all of which is converted by the phosphor coating 250, and emitted through the transparent layer 260.

As can be seen, by using a two-stage singulation process, the uncoated light emitting elements 220 can be situated on the wafer with minimal street 225 between the elements 220 on the wafer 210, while at the same time, by situating these closely situated elements 220 on a flexible film 230, the space 240 required for mechanically slicing/dicing a wafer-scale group of dice coated by phosphor material 250 can be provided by stretching the flexible film 230. The following table illustrates the increase in wafer area utilization that can be achieved by using this two-stage singulation process.

|  | Single Stage Dicing | | Two-Stage Dicing | | |
| --- | --- | --- | --- | --- | --- |
|  |  |  | Stage 1 | Stage 2 | |
| LED Size | Street Width | Wafer Utilization | Street Width | Street Width | Wafer Utilization |
| 500 × 500 um | 100 um | 64% | 30 um | 100 um | 88% |
| 500 × 500 um | 200 um | 36% | 30 um | 200 um | 88% |
| 1000 × 1000 um | 100 um | 81% | 30 um | 100 um | 94% |
| 1000 × 1000 um | 200 um | 64% | 30 um | 200 um | 94% |

As can be seen, in this example, the use of a two-stage dicing process allows for an increase in water utilization for a wafer with 500×500 um light emitting dies from as low as 36% to as high as 88%, and for a wafer with 1000×1000 um light emitting dies from as low as 64% to as high as 94%. At the same time larger streets that tolerate less precise manufacturing and improve yield can be utilized without decreasing wafer utilization.

While the invention has been illustrated and described in detail in the drawings and foregoing description, such illustration and description are to be considered illustrative or exemplary and not restrictive; the invention is not limited to the disclosed embodiments.

For example, it is possible to operate the invention in an embodiment wherein the light emitting element 220 comprises multiple light emitting elements that provide a common output wavelength or different output wavelengths, and/or the phosphor coating 250 includes different phosphors that convert the light emitted from the light emitting element 220 into light at different wavelengths. In like manner, the substrate 260 or the phosphor coating 250 may be shaped or otherwise formed to provide a particular optical pattern.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A structure comprising:
    a stretchable film;
    a plurality of light emitting elements situated on un-stretched segments of the stretchable film, each light emitting element comprising:
        a top surface and a bottom surface opposite the top surface, the bottom surface being situated on an un-stretched segment of the stretchable film; and
        one or more side surfaces connecting the top surface to the bottom surface;
    a plurality of streets between the light emitting elements, the streets being situated on stretched segments of the stretchable film, the stretched segments being in a state of greater strain than the un-stretched segments, the stretched segments having a strain greater than 5;
    a filler material that fills the plurality of streets from the bottom surface and extends only partly up along the one or more coating side surfaces but not completely along the one or more side surfaces: and
    a continuous wavelength conversion coating that extends over the light emitting elements and in the streets between the light emitting elements, such that; the wavelength conversion coating is in contact with the filler material at the base of the wavelength conversion coating, has a substantially flat top surface, and comprises side surfaces shaped by at least two side surfaces of two different light emitting elements.

2. The structure of claim 1, including a glass substrate that is attached atop the continuous wavelength conversion coating.

3. The structure of claim 1, wherein a width of the streets is at least 100 um.

4. The structure of claim 1, wherein the light emitting elements are fabricated from a single wafer having a first area before being diced into the light emitting elements, the bottom surface of each light emitting element has a second area, and the sum of second areas of the light emitting elements and the first area provide a wafer utilization that is equal to or greater than 88%.

* * * * *